US008461938B2

(12) United States Patent
Noori et al.

(10) Patent No.: US 8,461,938 B2
(45) Date of Patent: Jun. 11, 2013

(54) DIRECTIONAL COUPLERS FOR USE IN ELECTRONIC DEVICES, AND METHODS OF USE THEREOF

(75) Inventors: Basim Noori, Chandler, AZ (US); Stephen C. Cripps, Abergravenny (GB)

(73) Assignee: Freescale Semiconductor, Inc., Austin, TX (US)

( * ) Notice: Subject to any disclaimer, the term of this patent is extended or adjusted under 35 U.S.C. 154(b) by 294 days.

(21) Appl. No.: 12/916,068

(22) Filed: Oct. 29, 2010

(65) Prior Publication Data

US 2012/0105170 A1  May 3, 2012

(51) Int. Cl.
*H01P 5/18* (2006.01)
*H01P 3/08* (2006.01)

(52) U.S. Cl.
USPC .......................................... 333/116; 333/112

(58) Field of Classification Search
USPC .................. 333/109, 110, 111, 112, 115, 116
See application file for complete search history.

(56) References Cited

U.S. PATENT DOCUMENTS

| 3,593,208 A * | 7/1971 | Smith ........................... 333/112 |
| 4,011,528 A * | 3/1977 | Podell et al. .................. 333/112 |
| 4,139,827 A | 2/1979 | Russell |
| 4,376,921 A * | 3/1983 | Dickens et al. ............... 333/116 |
| 5,159,298 A | 10/1992 | Dydyk |
| 5,643,364 A * | 7/1997 | Zhao et al. ................. 118/723 E |
| 6,759,922 B2 | 7/2004 | Adar et al. |
| 6,825,738 B2 * | 11/2004 | Shumovich .................... 333/112 |
| 6,922,102 B2 * | 7/2005 | Myer et al. ....................... 330/51 |
| 7,564,325 B2 | 7/2009 | Hussain et al. |

OTHER PUBLICATIONS

Talalaevsky, L., Using high-directivity couplers in cell phone PA control, Apr. 2006, Retrieved from Internet, http://rfdesign.com/mag/604RFDF3.pdf.
Kim, C., et al., A Design of Microstrip Directional Coupler for High Directivity and Tight Coupling, Microwave Conference, 2001. 31 European, Sep. 2001.

* cited by examiner

*Primary Examiner* — Dean O Takaoka
(74) *Attorney, Agent, or Firm* — Sherry W. Schumm

(57) ABSTRACT

Embodiments include directional couplers, electronic devices within which they are incorporated, and methods for using directional couplers. An embodiment of a directional coupler includes a set of coupled lines and a reflection coefficient manipulator. The set of coupled lines includes first and second conductive structures. The first conductive structure has a first port, a second port, and a substantially linear, first conductive central portion between the first port and the second port. The second conductive structure has a third port, a fourth port, and a substantially linear, second conductive central portion between the third port and the fourth port. The reflection coefficient manipulator is integrated with the set of coupled lines and is disposed in proximity to a gap between the first and second conductive structures. The reflection coefficient manipulator, which includes slots, protrusions, or both, is configured to equate reflection coefficients of the first and second conductive structures.

20 Claims, 8 Drawing Sheets

DIRECTIONAL COUPLERS FOR USE IN ELECTRONIC DEVICES, AND METHODS OF USE THEREOF

TECHNICAL FIELD

Embodiments relate to directional couplers, electronic devices in which they are incorporated, and methods of using directional couplers.

BACKGROUND

Directional couplers are commonly used for isolating, separating or combining signals. A typical directional coupler includes a coupling line (or auxiliary arm) that is positioned in proximity to a main line (or transmission line), with the coupling and main lines being electrically isolated from each other across an intervening non-conductive medium (e.g., air and/or a dielectric material). When a forward wave is provided in the main line (e.g., a wave having a direction of propagation from an input port toward an output port of the main line), an induced wave is produced in the coupling line. The magnitude of the induced wave is proportional to the magnitude of the forward wave, and the ratio of the induced power to the input power is referred to as the "coupling factor." The "directivity" of a particular directional coupler is the difference (e.g., in decibels (dB)) of the power output at a coupled port, when power is transmitted in the desired direction, to power output at the same coupled port when the same amount of power is transmitted in the opposite direction.

DETAILED DESCRIPTION

Figure 1:
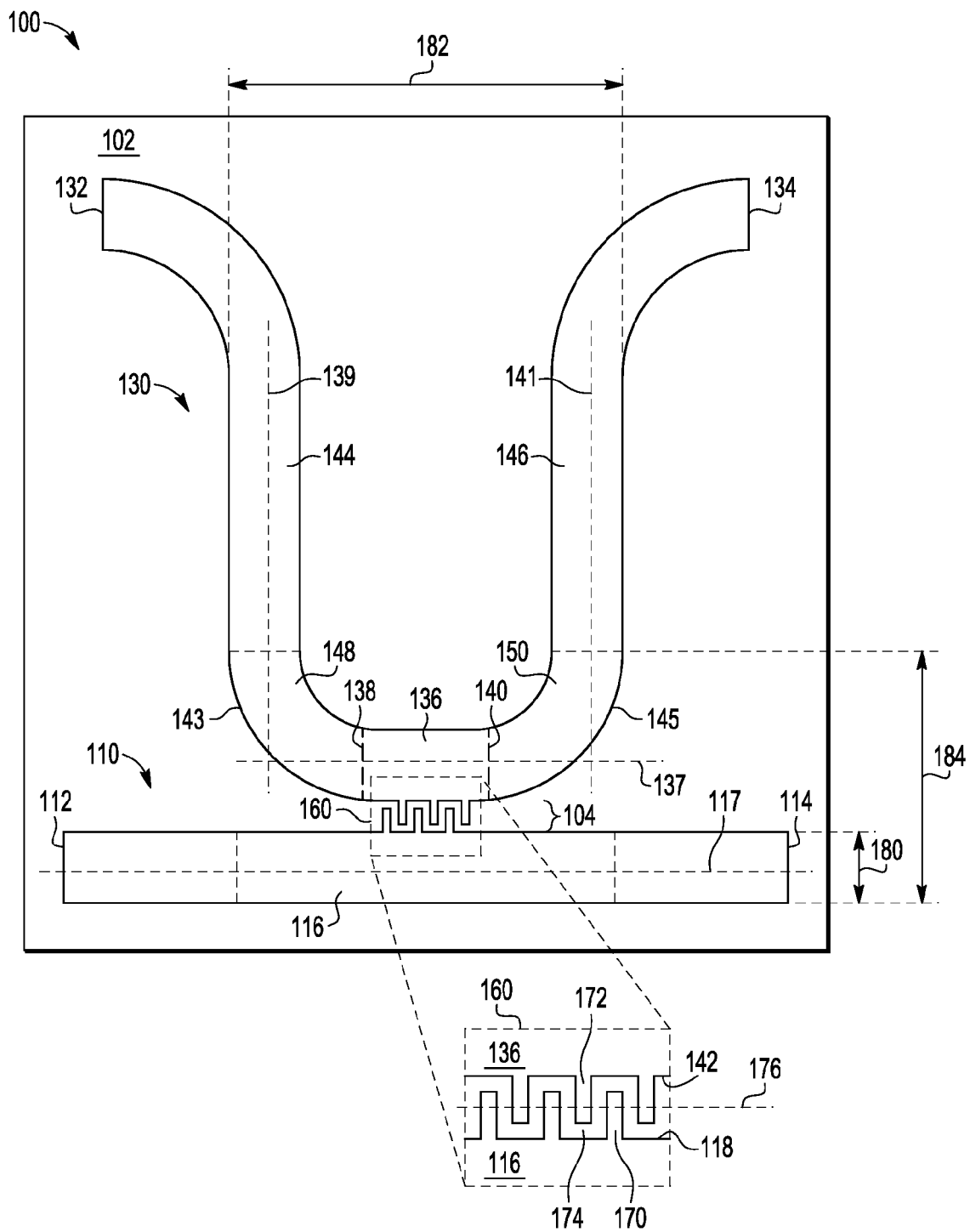
FIG. 1 illustrates a directional coupler, according to an example embodiment.

Desirably, a directional coupler will exhibit relatively high directivity and relatively low loss over a bandwidth of interest (e.g., the operational bandwidth of a device or system). Although some traditional directional couplers have sufficiently high directivity and low loss for certain applications and within relatively narrow bandwidths, the same directional couplers may have insufficient performance for other applications and/or for wider or different bandwidth applications. In addition, traditional wideband directional couplers tend to be relatively large, and therefore unsuitable for use with systems that require low loss in which transmission lines are small (e.g., in a micro strip environment), and/or for use in integrated circuit applications. Accordingly, designers of directional couplers continue to strive for new directional coupler configurations that are relatively compact, that exhibit relatively high directivity over a wide bandwidth, and that are characterized by relatively low loss at all frequencies of interest (e.g., high frequencies).

Embodiments include directional couplers configured for use in determining electrical characteristics of electrical components and systems, and methods for using such directional couplers. More particularly, directional couplers of the various embodiments may be used to determine electrical characteristics of an electrical component or system (e.g., a "device under test" (DUT) or "system under test" (SUT)), and the determined electrical characteristics may, in turn, be used to alter the design or operation of the electrical component or system.

For example, directional couplers of the various embodiments readily may be used by a device designer and/or modeling engineer to measure time-domain and/or frequency-domain waveforms along a transmission line, which reveals modeled versus measured performance of a DUT or SUT. Depending on the measured results, the designer or engineer may initiate design changes for the DUT or SUT. As the below description indicates, measurements that are performed using directional couplers of the various embodiments may be made efficiently, thus potentially reducing the design cycle time for a given DUT or SUT. For example, a particular embodiment is described herein in which a directional coupler embodiment is used to enable measurement of time-domain and/or frequency-domain waveforms in a Doherty amplifier, although various embodiments may be used to enable measurement of time-domain and/or frequency-domain waveforms in other types of amplifiers (e.g., linear class AB amplifiers, efficient drain-modulated amplifiers, and so on), devices, or systems, as well. The measured results enable a designer to adjust various aspects of the Doherty amplifier design, and the efficiency in which the various embodiments enable such measurements to occur may significantly reduce the design cycle time for the amplifier.

As another example, directional couplers of the various embodiments may be integrated into devices and systems in which incident and reflected waveform monitoring is desired during the operational life of the device or system. For example, but not by way of limitation, directional couplers of the various embodiments may be integrated into wireless communication devices, reflectometers, and load-pull systems, among other things. When a directional coupler according to an embodiment is incorporated in such a device or system, the directional coupler may be utilized during operation of the device or system to determine incident versus reflected waveforms, and that information may be used to adjust the operation of the device or system, as will be described in more detail later.

As will be described in more detail below, the various directional coupler embodiments each include a "reflection coefficient manipulator," which is configured to change the characteristic impedance of either or both of the main line and the coupling line (or the transmission line and auxiliary arm), so that even and odd reflection coefficients are equated. By equating the even and odd reflection coefficients, the directivity of the directional coupler is independent of the coupler length. Accordingly, the various embodiments may be implemented in relatively small dimensions (e.g., in a micro strip environment). In addition, at least some of the directional coupler embodiments include a tapered or curved "capacitive coupling structures," which provide gradual capacitive coupling as a function of frequency to increase the overall operating bandwidth. The various embodiments of directional couplers described herein may provide one or more advantages over conventional directional couplers. For example, directional couplers of various embodiments may provide relatively high directivity over a wide bandwidth (e.g., 0.5 to 12 gigahertz (GHz) or other frequency ranges), may exhibit relatively low loss at high frequency, and/or may have the characteristic of being readily insertable in a micro strip (or other) environment. These and other advantages may become apparent from the figures and the below, detailed description of various embodiments.

FIG. 1 illustrates a directional coupler 100, according to an example embodiment. Directional coupler 100 includes a set of electrically conductive structures, which are fabricated on a surface of a substrate 102. Substrate 102 may be, for example, a printed circuit board, a semiconductor wafer or another type of rigid structure conducive to providing structural support for directional coupler 100. According to an embodiment, substrate 102 has a relative dielectric in a range of about 2.0-6.0, although substrate 102 may have a lower or higher relative dielectric, in other embodiments. In various embodiments, directional coupler 100 may be a lumped element, a portion of a transmission structure in an integrated circuit, or a printed component on a printed circuit board. Substrate 102 may include an embedded ground structure (e.g., a ground plane positioned below a top surface of the substrate 102) to which portions of directional coupler 100 may be electrically connected.

According to an embodiment, directional coupler 100 is a micro strip directional coupler, in which the electrically conductive structures of the directional coupler 100 are thin-film, electrically conductive structures (e.g., micro strip lines). For example, the electrically conductive structures of the directional coupler 100 may have thicknesses (dimension going into the page, in FIG. 1) in a range of about 50 to 100 micrometers and widths 180 in a range of about 0.40 to 8.0 millimeters, although the thicknesses and/or widths of the electrically conductive structures may be smaller or larger, in other embodiments. Although the overall dimensions of directional coupler 100 may vary greatly, a width 182 of directional coupler 100 may be in a range of about 8 to 15 millimeters, and a height 184 of directional coupler 100 may be in a range of about 9 to 18 millimeters, in an embodiment. In other embodiments, the width 182 and height 184 may be less than or greater than the above-given ranges.

In a particular embodiment, directional coupler 100 includes a first conductive structure 110, a second conductive structure 130, and a reflection coefficient manipulator 160. The first and second conductive structures 110, 130 are electrically isolated from each other, and the reflection coefficient manipulator 160 is disposed in proximity to a gap 104 between the first and second conductive structures 110, 130. Essentially, the first conductive structure 110 is configured to function as a main line or transmission line for a device or system, and the second conductive structure 130 is configured to function as a coupling line or auxiliary arm. As will be described in more detail below, the reflection coefficient manipulator 160 is configured to adjust relative signal phase velocities in the first and second conductive structures 110, 130 so that the reflection coefficients in the first and second conductive structures 110, 130 are substantially equal, in an embodiment.

The first conductive structure 110 has a first port 112 and a second port 114, and the second conductive structure 130 has a third port 132 and a fourth port 134. When a signal is provided to the first port 112 of the first conductive structure 110, a forward wave is produced that travels from the first port 112 to the second port 114. This forward wave, and any reflections of the forward wave in the first conductive structure 110, produce induced waves in the second conductive structure 130. As will be described in more detail later, the forward, reflected, and induced waves may be analyzed (e.g., by a vector network analyzer or a system component configured to analyze the waves) to determine S-parameters or other characteristics of system components that produced the forward wave. The S-parameters or other determined characteristics may thereafter be used to determine design changes for the system components that produced the forward wave (e.g., amplifiers, transmitters, and so on), or to alter operations of the system components that produced the forward wave (e.g., for purposes of power control).

The first conductive structure 110 has a first conductive central portion 116 between the first and second ports 112, 114. The first conductive central portion 116 is substantially linear along a principal axis 117, and is partially defined by edge 118. The second conductive structure 130 has a second conductive central portion 136 between the third and fourth ports 132, 134. The second conductive central portion is substantially linear along a principal axis 137, and is partially defined by ends 138, 140 and edge 142. According to an embodiment, the edge 142 of the second conductive central portion 136 is spatially separated from the edge 118 of the first conductive central portion 116. In addition, the principal axis 137 of the second conductive central portion 136 is substantially parallel with the principal axis 117 of the first conductive central portion 116.

In an embodiment, the second conductive structure 130 also has first and second conductive arms 144, 146 and first and second capacitive coupling structures 148, 150. The first conductive arm 144 and the first capacitive coupling structure 148 are located between the third port 132 and one end 138 of the second conductive central portion 136, and the second arm 146 and second capacitive coupling structure 150 are located between the fourth port 134 and the other end 140 of the second conductive central portion 136, as shown in FIG. 1. According to an embodiment, principal axes 139, 141 of the first and second conductive arms 144, 146 are substantially perpendicular to the principal axis 137 of the second conductive central portion 136, although principal axes 139, 141 may not be perpendicular to the principal axis 137, in other embodiments.

The first and second capacitive coupling structures 148, 150 each have an edge 143, 145 oriented toward the first conductive structure 110. According to an embodiment, and as shown in FIG. 1, edges 143, 145 have continuously curving (i.e., non-linear) shapes between arms 144, 146 and either end 138, 140 of the second conductive central portion 136. Although edges 143, 145 are shown to be semi-circular, it is to be understood that edges 143, 145 may have other curved shapes, as well, including shapes in which one or more points of inflection are present. In other embodiments, each of edges 143, 145 may comprise a sequence of multiple linear sections.

Either way, the shape of edges 143, 145 establishes smoothly varying distances between points along each edge 143, 145 and closest portions of the first conductive structure 110. More specifically, for example, a first distance is present between a first point of edge 143 and the first conductive structure 110, and a second distance is present between a second point of edge 143 and the first conductive structure 110. Between the first and second points, the distances between edge 143 and first conductive structure 110 smoothly and continuously vary. Accordingly, the curved edges 143, 145 provide smoothly and gradually varying capacitive coupling as a function of frequency between the first and second conductive structures 110, 130. According to a specific embodiment, the curved edges 143, 145 enable directional coupler 100 to operate effectively over a bandwidth between about 500 megahertz (MHz) to about 12 gigahertz (GHz), although the shape of edges 143, 145 may be selected to enable effective operations across a wider, narrower, or different bandwidth.

Reflection coefficient manipulator 160 is integrated with the first and second conductive structures 110, 130, and is disposed in proximity to gap 104. Essentially, reflection coefficient manipulator 160 is configured to adjust the characteristic impedance of the first and second conductive structures 110, 130, and thus to adjust the relative signal phase velocities in the first and second conductive structures 110, 130. In an embodiment, the adjustments in the characteristic impedances are made so that the reflection coefficients in the first and second conductive structures 110, 130 are equal, substantially equal, or precisely equal. In other words, reflection coefficient manipulator 160 is configured to equate a first signal phase velocity in the first conductive structure 110 with a second signal phase velocity in the second conductive structure 130. Reflection coefficient manipulator 160 is configured to equate the reflection coefficients in the first and second conductive structures 110, 130, even when incident and reflected odd and even voltages are unequal, according to an embodiment. As used herein, the term "precisely equal" means that a first value (e.g., a first reflection coefficient) is within +/−0.1% of a second value (e.g., a second reflection coefficient), the term "equal" means that a first value (e.g., a first reflection coefficient) is within +/−1% of a second value (e.g., a second reflection coefficient), and the term "substantially equal" means that a first value (e.g., a first reflection coefficient) is within +/−5% of a second value (e.g., a second reflection coefficient). The term "equate" means to cause two values to be precisely equal, equal, or substantially equal.

According to an embodiment, reflection coefficient manipulator 160 comprises a set of first conductive protrusions 170 coupled with the first conductive central portion 116, and a set of second conductive protrusions 172 coupled with the second conductive central portion 136. As used herein, the term "protrusion" means a structure that extends outwardly from an edge (e.g., edge 142 or 118) of another structure. In FIG. 1, first and second conductive protrusions 170, 172 are shown to be rectangular in shape, where a width of each protrusion 170, 172 (i.e., the dimension parallel to edges 142, 118) is less than the height of each protrusion 170, 172 (i.e., the dimension perpendicular to edges 142, 118). In other embodiments, protrusions 170, 172 may have widths that are equal to or greater than the heights, and/or protrusions 170, 172 may have shapes other than rectangular shapes (e.g., triangular, curved, and so on). In addition, in FIG. 1, each protrusion 170, 172 is shown to have a height that is greater than half of the width of gap 104, so that the distal ends of protrusions 170, 172 intersect a line 176 that is parallel to edges 142, 118. In other embodiments, some or all of protrusions 170, 172 may have heights that are less than or equal to half of the width of gap 104.

The first and second conductive protrusions 170, 172 are integrally formed with the first and second conductive central portions 116, 136 (e.g., protrusions 170, 172 are formed of the same materials and during the same manufacturing step as the first and second conductive central portions 116, 136), in an embodiment. In an alternate embodiment, the first and second conductive protrusions 170, 172 are not integrally formed with the first and second conductive central portions 116, 136 (e.g., protrusions 170, 172 are formed of different materials and/or during a different manufacturing step than the first and second conductive central portions 116, 136).

The first conductive protrusions 170 extend from the first edge 118 of the first conductive central portion 116 toward the second edge 142 of the second conductive central portion 136. The second conductive protrusions 172 extend from the second edge 142 of the second conductive central portion 136 toward the first edge 118 of the first conductive central portion 116, and the second conductive protrusions 172 are interleaved with the first conductive protrusions 170. As used herein, the term "interleaved" means that a protrusion associated with one of the conductive central portions (e.g., one of protrusions 172 associated with second conductive central portion 136) extends into each space (e.g., space 174) between adjacent protrusions of another one of the conductive central portions (e.g., protrusions 170 associated with first conductive central portion 116), and vice versa. Accordingly, protrusions 170, 172 would be encountered in an alternating sequence when traveling along a line 176 that spans the width of reflection coefficient manipulator 160. In alternate embodiments, more than one protrusion associated with one of the conductive central portions may extend into each space between adjacent protrusions of another one of the conductive central portions, and vice versa. In addition or alternatively, and as will be discussed in more detail later, the term "interleaved" means that a protrusion associated with one conductive structure (e.g., one of protrusions 372, 572, 672 of FIGS. 3, 5, 6) extends into a slit of another conductive structure (e.g., one of slits 362, 562, 662 of FIGS. 3, 5, 6). Either way, the interleaved configurations of FIGS. 1, 3, 5, and 6 provide control of the capacitance and inductance of each of the first and second conductive structures (e.g., first and second conductive structures 110, 130, 310, 330, 510, 530, 610, 630 of FIGS. 1, 3, 5, 6).

The first and second conductive protrusions 170, 172 function to equate the reflection coefficients of the first and second conductive structures 110, 130 by affecting the phase velocities of signals transmitted along the first and second conductive structures 110, 130, respectively. According to a particular embodiment, the first and second conductive protrusions 170, 172 are configured to increase the phase velocities of signals transmitted along the first and second conductive structures 110, 130, respectively, to equal or substantially equal speeds. Equating the phase velocities, and thus the reflection coefficients, may be accomplished through a number of variations in the configurations of the first and second conductive protrusions 170, 172. For example, although only three first protrusions 170 and three second protrusions 172 are shown in FIG. 1, it is to be understood that a reflection coefficient manipulator may have more or fewer first and/or second conductive protrusions in order to achieve equal or substantially equal reflection coefficients, in other embodiments. In particular alternate embodiments, either one of conductive protrusions 170, 172 may be excluded (e.g., the reflection coefficient manipulator 160 may include only one set of protrusions 170 or 172). In addition, as mentioned previously, although various relative protrusion dimensions (e.g., height, width), distances between adjacent protrusions, and depths of interleaving are indicated in FIG. 1, it is to be understood that the relative dimensions, distances, and depths may be different in order to achieve an equating of the reflection coefficients. Such alternate embodiments apply also to protrusions depicted in conjunction with other embodiments discussed herein (e.g., embodiments of FIGS. 3, 5, and 6).

Figure 2:
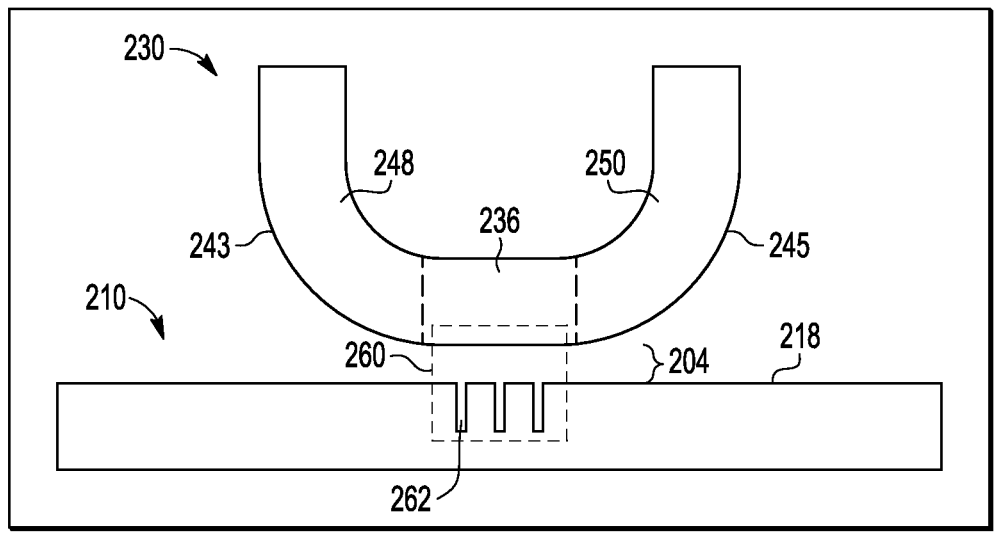
FIGS. 2-6 illustrate directional couplers, according to various other example embodiments.

FIG. 2 illustrates a directional coupler 200, according to another example embodiment. Directional coupler 200 is similar to directional coupler 100 (FIG. 1) in that directional coupler 200 includes a first conductive structure 210 configured to function as a main line or transmission line, and a second conductive structure 230 configured to function as a coupling line or auxiliary arm. In addition, the second conductive structure 230 includes first and second capacitive coupling structures 248, 250 each have a continuously curving edge 243, 245 oriented toward the first conductive structure 210. However, the reflection coefficient manipulator 260 of directional coupler 200 is differently configured from the reflection coefficient manipulator 160 of directional coupler 100 (FIG. 1). In particular, reflection coefficient manipulator 260 includes a set of slits 262 in the first conductive structure 210, which extend into the first conductive structure 210 from the edge 218 of the first conductive structure 210, and which are positioned opposite a central conductive portion 236 of second conductive structure 230 across gap 204. Essentially, slits 262 function to decrease the phase velocity of signals transmitted over the first conductive structure 210, in order to equate the reflection coefficients of the first and second conductive structures 210, 230.

As used herein, the term "slit" means an area that lacks conductive material that extends inwardly from an edge (e.g., edge 218) of a structure (e.g., first conductive structure 210). In FIG. 2, slits 262 are shown to be rectangular in shape, where a width of each slit 262 (i.e., the dimension parallel to edge 218) is less than the depth of each slit 262 (i.e., the dimension perpendicular to edge 218). In other embodiments, slits 262 may have widths that are equal to or greater than the depths, and/or slits 262 may have shapes other than rectangular shapes (e.g., triangular, curved, and so on).

Slits 262 function to equate the reflection coefficients of the first and second conductive structures 210, 230 by affecting the phase velocities of signals conveyed along the first conductive structure 210. According to a particular embodiment, slits 262 are configured to decrease the phase velocities of signals transmitted along the first conductive structure 210, to phase velocities that are equal or substantially equal to phase velocities of signals traveling along the second conductive structure 230. Equating the phase velocities, and thus the reflection coefficients, may be accomplished through a number of variations in the configurations of the slits 262. For example, although only three slits 262 are shown in FIG. 2, it is to be understood that a reflection coefficient manipulator may have more or fewer slits in order to achieve equal or substantially equal reflection coefficients, in other embodiments. In addition, as mentioned previously, although various relative slit dimensions (e.g., depth, width) and distances between adjacent slits are indicated in FIG. 2, it is to be understood that the relative dimensions and distances may be different in order to achieve an equating of the reflection coefficients. Such alternate embodiments apply also to slits depicted in conjunction with other embodiments discussed herein (e.g., embodiments of FIGS. 3-6). The non-interleaved configuration of FIG. 2 (and the other non-interleaved configuration depicted in FIG. 4) provides control of the reactance of one of the first or second conductive structures 210, 230.

Figure 3:
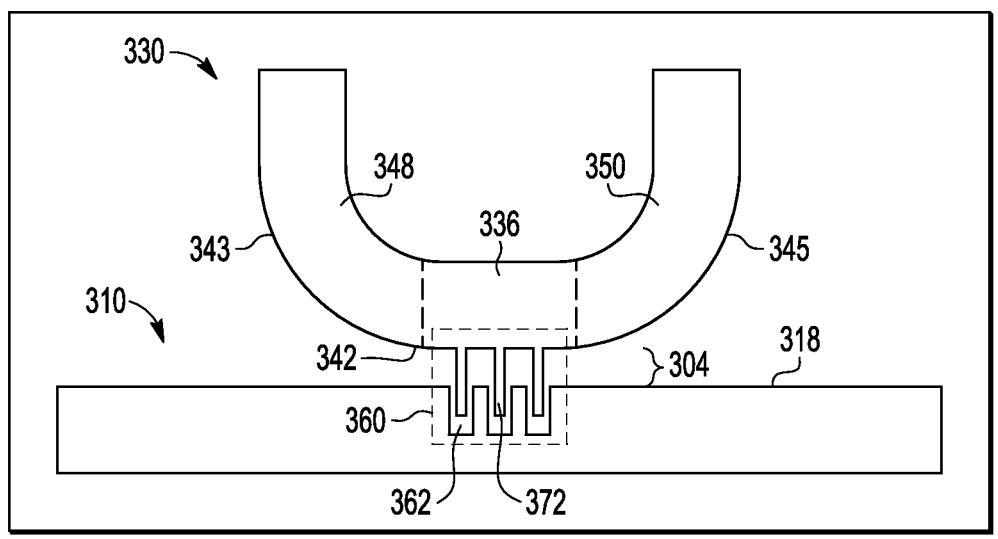

FIG. 3 illustrates a directional coupler 300, according to another example embodiment. Directional coupler 300 is similar to directional coupler 200 (FIG. 2) in that directional coupler 300 includes a first conductive structure 310 configured to function as a main line or transmission line, and a second conductive structure 330 configured to function as a coupling line or auxiliary arm. In addition, the second conductive structure 330 includes first and second capacitive coupling structures 348, 350 each have a continuously curving edge 343, 345 oriented toward the first conductive structure 310, and the reflection coefficient manipulator 360 of directional coupler 300 includes slits 362 in the first conductive structure 310. However, the reflection coefficient manipulator 360 is differently configured from the reflection coefficient manipulator 260 of directional coupler 200 (FIG. 2), in that reflection coefficient manipulator 360 also includes a set of protrusions 372 that extend from edge 342 of a central conductive portion 336 of second conductive structure 330. According to an embodiment, protrusions 372 have lengths (i.e., the dimension perpendicular to edge 342) that are greater than the width of gap 304, so that distal ends of protrusions 372 extend beyond edge 318 of the first conductive structure 310 and into slits 362. In alternate embodiments, protrusions 372 may have lengths that are less than the width of gap 304. As discussed previously, slits 362 function to decrease the phase velocity of signals transmitted over the first conductive structure 310, and protrusions 372 function to increase the phase velocity of signals traveling along the second conductive structure 330, in order to equate the reflection coefficients of the first and second conductive structures 310, 330.

Figure 4:
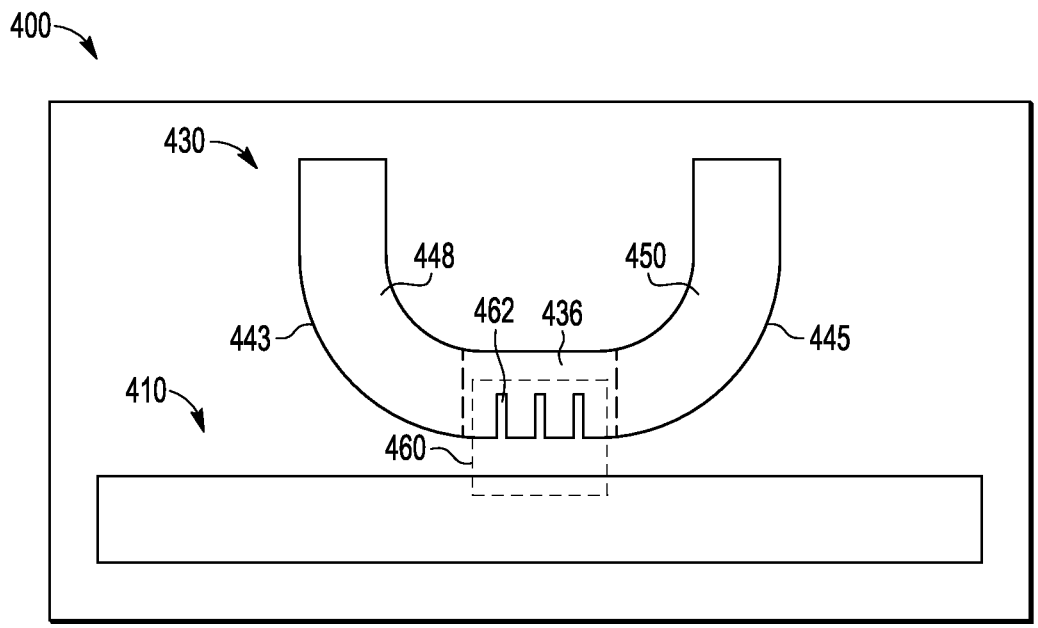

FIG. 4 illustrates a directional coupler 400, according to another example embodiment. Directional coupler 400 is similar to directional coupler 200 (FIG. 2) in that directional coupler 400 includes a first conductive structure 410 configured to function as a main line or transmission line, and a second conductive structure 430 configured to function as a coupling line or auxiliary arm. In addition, the second conductive structure 430 includes first and second capacitive coupling structures 448, 450 each having a continuously curving edge 443, 445 oriented toward the first conductive structure 410. However, the reflection coefficient manipulator 460 is differently configured from the reflection coefficient manipulator 260 of directional coupler 200 (FIG. 2), in that the reflection coefficient manipulator 460 of directional coupler 400 includes slits 462 in the central conductive portion 436 of the second conductive structure 430, rather than in the first conductive structure 410. As discussed previously, slits 462 function to decrease the phase velocity of signals transmitted over the second conductive structure 430, in order to equate the reflection coefficients of the first and second conductive structures 410, 430.

Figure 5:
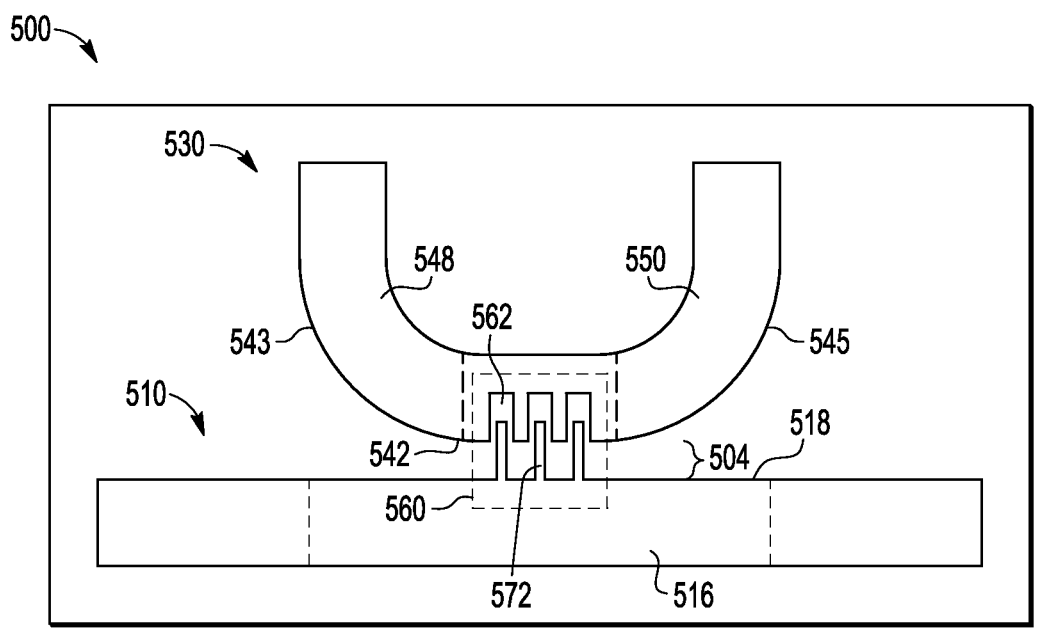

FIG. 5 illustrates a directional coupler 500, according to another example embodiment. Directional coupler 500 is similar to directional coupler 400 (FIG. 4) in that directional coupler 500 includes a first conductive structure 510 configured to function as a main line or transmission line, and a second conductive structure 530 configured to function as a coupling line or auxiliary arm. In addition, the second conductive structure 530 includes first and second capacitive coupling structures 548, 550 each having a continuously curving edge 543, 545 oriented toward the first conductive structure 510, and the reflection coefficient manipulator 560 of directional coupler 500 includes slits 562 in the second conductive structure 530. However, the reflection coefficient manipulator 560 is differently configured from the reflection coefficient manipulator 460 of directional coupler 400 (FIG.

4), in that reflection coefficient manipulator 560 also includes a set of protrusions 572 that extend from edge 518 of a central conductive portion 516 of first conductive structure 510. According to an embodiment, protrusions 572 have lengths (i.e., the dimension perpendicular to edge 518) that are greater than the width of gap 504, so that distal ends of protrusions 572 extend beyond edge 542 of the second conductive structure 530 and into slits 562. In alternate embodiments, protrusions 572 may have lengths that are less than the width of gap 504. As discussed previously, slits 562 function to decrease the phase velocity of signals transmitted over the second conductive structure 530, and protrusions 572 function to increase the phase velocity of signals traveling along the first conductive structure 510, in order to equate the reflection coefficients of the first and second conductive structures 510, 530.

Figure 6:
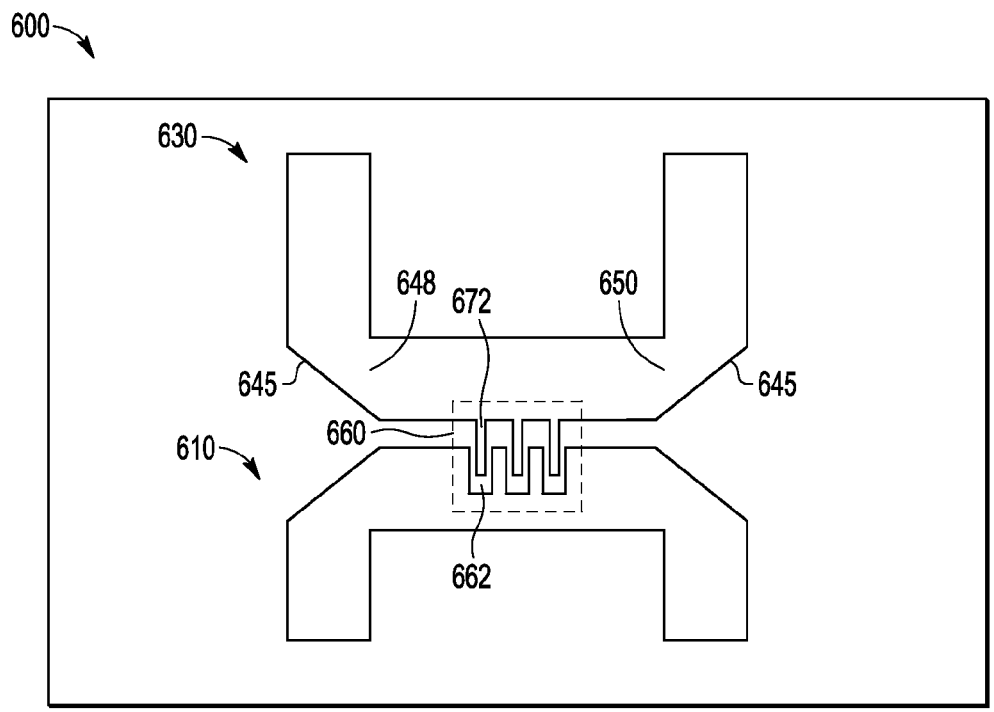

FIG. 6 illustrates a directional coupler 600, according to another example embodiment. Directional coupler 600 is similar to directional coupler 300 (FIG. 3) in that directional coupler 600 includes a first conductive structure 610 configured to function as a main line or transmission line, a second conductive structure 630 configured to function as a coupling line or auxiliary arm, and a reflection coefficient manipulator 660 that includes a set of slits 662 in the first conductive structure 610 and a set of protrusions 672 extending from the second conductive structure 630. However, directional coupler 600 is differently configured from directional coupler 300 (FIG. 3), in that the second conductive structure 630 includes first and second capacitive coupling structures 648, 650 each having substantially linear edges 643, 645 oriented toward the first conductive structure 610. In alternate embodiments, directional coupler 600 may have a differently configured reflection coefficient manipulator 660 (e.g., such as reflection coefficient manipulators 160, 260, 460, or 560, FIGS. 1, 2, 4, 5).

As discussed previously, embodiments of directional couplers discussed herein (e.g., in conjunction with FIGS. 1-6) may be used to enable measurement of time-domain waveforms and/or frequency-domain in a Doherty amplifier or another type of amplifier, device, or system. As indicated previously, by incorporating a directional coupler embodiment into an amplifier or other system, measured results may be efficiently obtained, thus enabling a designer efficiently to adjust various aspects of the design of the amplifier or system.

Figure 7:
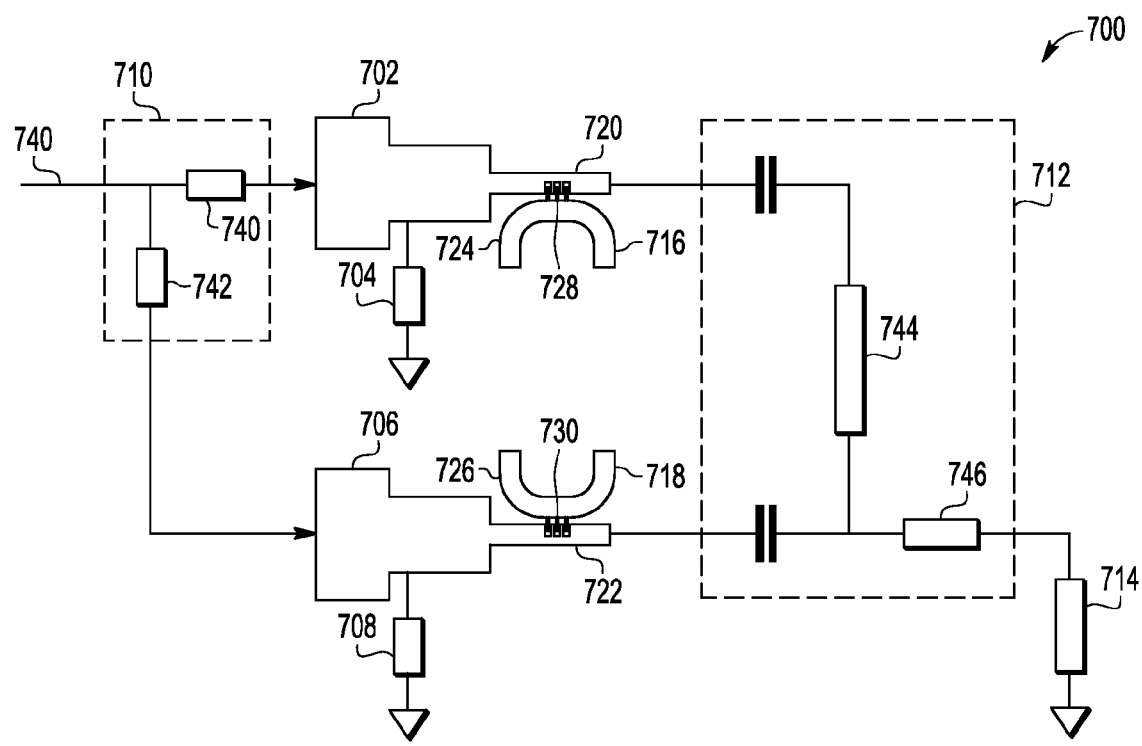
FIG. 7 illustrates a simplified block diagram of a Doherty amplifier with directional couplers, according to an example embodiment.

FIG. 7 illustrates a simplified block diagram of a Doherty amplifier 700 with directional couplers 716, 718, according to an example embodiment. Doherty amplifier 700 includes a carrier amplifier 702, a first output matching circuit (OMC) 704, a peaking amplifier 706, a second OMC 708, a power divider 710, a power combiner 712, termination 714 (e.g., a 50 Ohm termination), and directional couplers 716, 718 integrated with output, micro strip transmission lines 720, 722 of the carrier and peaking amplifiers 702, 706, respectively.

Directional couplers 716, 718 may have a configuration such as any one of the embodiments illustrated and/or described in conjunction with FIGS. 1-6, in various embodiments. More specifically, output transmission lines 720, 722 may correspond to any one of the first conductive structures (e.g., first conductive structures 110, 210, 310, 410, 510, 610, FIGS. 1-6), and coupled lines 724, 726 of directional couplers 716, 718 may correspond to any one of the second conductive structures (e.g., second conductive structures 130, 230, 330, 430, 530, 630, FIGS. 1-6). In addition, directional couplers 716, 718 each include a reflection coefficient manipulator 728, 730 (e.g., one of reflection coefficient manipulators 160, 260, 360, 460, 560, 660 or variations thereof discussed in conjunction with FIGS. 1-6).

During operation, carrier amplifier 702 is biased to operate in Class AB mode, and peaking amplifier 706 is biased to operate in Class C mode. Input signal 740 is split by power divider 710 equally, and provided to each amplifier 702, 706. More specifically, power divider 710 includes a splitter 730 that divides and feeds a portion of input signal 740 to amplifier 702, and a splitter/delay line 742, which divides, delays, and feeds a portion of input signal 740 to amplifier 706 with a 90 degree difference in phase from the signal that is provided to amplifier 702. After the signals are amplified by amplifiers 702, 706, the amplifier output signals are re-combined by power combiner 712. Power combiner 712 includes an inverter 744, which eliminates the phase difference between the signals produced by amplifiers 702, 706, and a transformer 746, which transforms the combined impedances at the intersection of inverter 744 and transformer 746 to the system reference impedance. Both amplifiers 702, 706 operate when the input signal 740 peaks. However, as the input signal 740 decreases in power, peaking amplifier 706 turns off, and only carrier amplifier 702 operates.

Each of OMCs 704, 708 transform a terminal impedance into an optimal output impedance for its respective amplifier 702, 706. According to an embodiment, OMCs 704, 708 are tunable, and information (e.g., S-parameters) obtained using directional couplers 716, 718 may be analyzed to determine how OMCs 704, 708 should be tuned to ensure adequate or optimal performance of Doherty amplifier 700. This tuning may take place, for example, one or more times during the design cycle for Doherty amplifier 700 (e.g., in a design/test facility or the factory). According to an embodiment, an input signal 740 is provided to the Doherty amplifier 700, and incident and reflected waveforms present in the directional couplers 716, 718 are measured by test equipment (not illustrated) that is coupled to the various ports of directional couplers 716, 718. Based on the measurements, the OMCs 704, 708 may be tuned so that the Doherty amplifier 700 operates in a more optimal manner.

Figure 8:
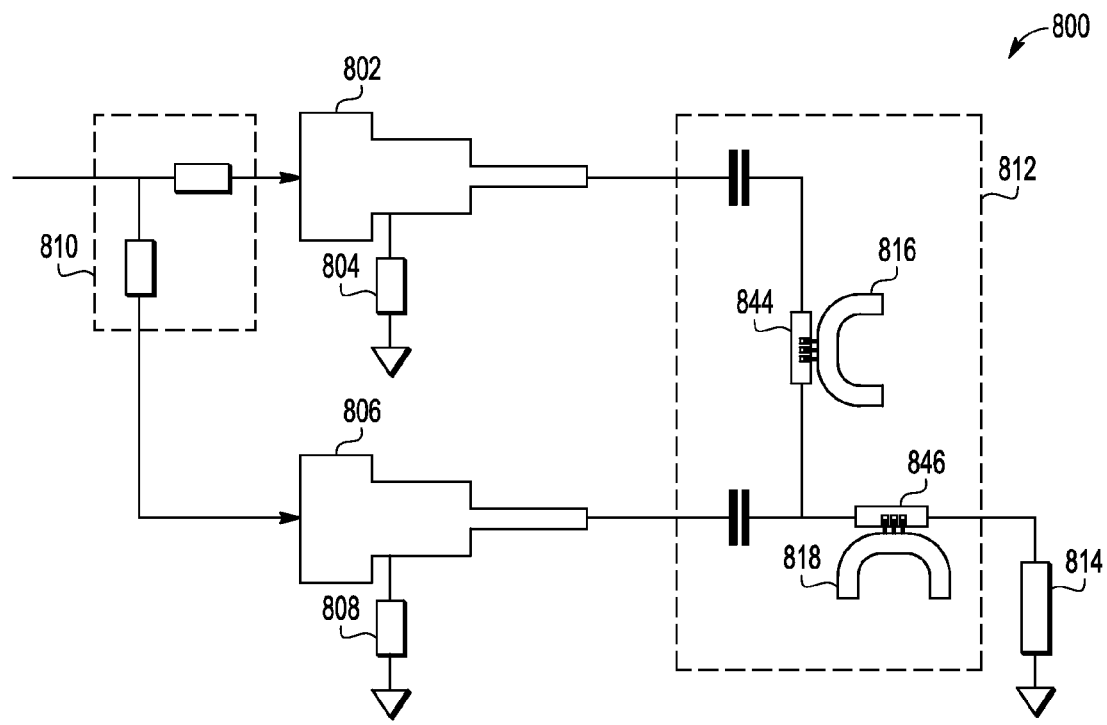
FIG. 8 illustrates a simplified block diagram of a Doherty amplifier with directional couplers, according to another example embodiment.

FIG. 8 illustrates a simplified block diagram of a Doherty amplifier 800 with directional couplers 816, 818, according to another example embodiment. The Doherty amplifier 800 of FIG. 8 is similar to Doherty amplifier 700 (FIG. 7), in that Doherty amplifier 800 also includes a carrier amplifier 802, a first OMC 804, a peaking amplifier 806, a second OMC 808, a power divider 810, a power combiner 812, and termination 814 (e.g., a 50 Ohm termination). In addition, power combiner 812 includes an inverter 844 and a transformer 846. However, Doherty amplifier 800 differs, in that it includes directional couplers 816, 818 (e.g., directional couplers 100, 200, 300, 400, 500, 600, FIGS. 1-6) integrated with inverter 844 and transformer 846, respectively (rather than with the output, micro strip transmission lines of the carrier and peaking amplifiers). Test equipment (not illustrated) may be coupled with the various ports of directional coupler 816, which enables a device designer and/or modeling engineer to monitor the time-domain waveforms produced by the devices at the inverter 844, and then to adjust the impedances accordingly to optimize the performance of the overall circuit. Test equipment (not illustrated) also may be coupled with the various ports of directional coupler 818, which allows the designer and/or engineer to monitor the transformed waveforms, and then to adjust the transformer 846 impedance to optimize overall circuit performance.

Figure 9:
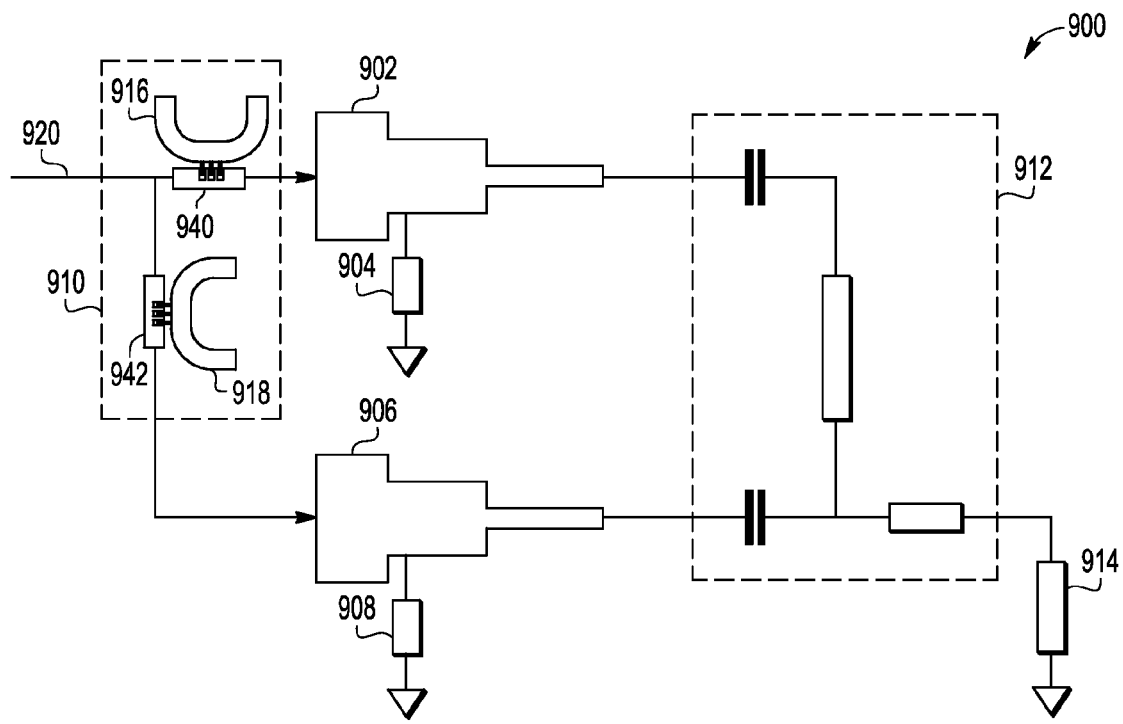
FIG. 9 illustrates a simplified block diagram of a Doherty amplifier with directional couplers, according to yet another example embodiment.

FIG. 9 illustrates a simplified block diagram of a Doherty amplifier 900 with directional couplers 916, 918, according to yet another example embodiment. The Doherty amplifier 900 of FIG. 9 is similar to Doherty amplifier 700 (FIG. 7), in that Doherty amplifier 900 also includes a carrier amplifier 902, a first OMC 904, a peaking amplifier 906, a second OMC 908, a power divider 910, a power combiner 912, and termination 914 (e.g., a 50 Ohm termination). In addition, power divider 910 includes a splitter 940 and a splitter/delay line 942. However, Doherty amplifier 900 differs, in that it includes directional couplers 916, 918 (e.g., directional couplers 100, 200, 300, 400, 500, 600, FIGS. 1-6) integrated with splitter 940 and splitter/delay line 942, respectively (rather than with the output, micro strip transmission lines of the carrier and peaking amplifiers). Test equipment (not illustrated) may be coupled with the various ports of directional couplers 916, 918, which allows a device designer and/or modeling engineer to monitor the input signal 920, and to optimize the phase relationship of the signal by adjusting lengths of splitter 940 and/or splitter/delay line 942, respectively.

Figure 10:
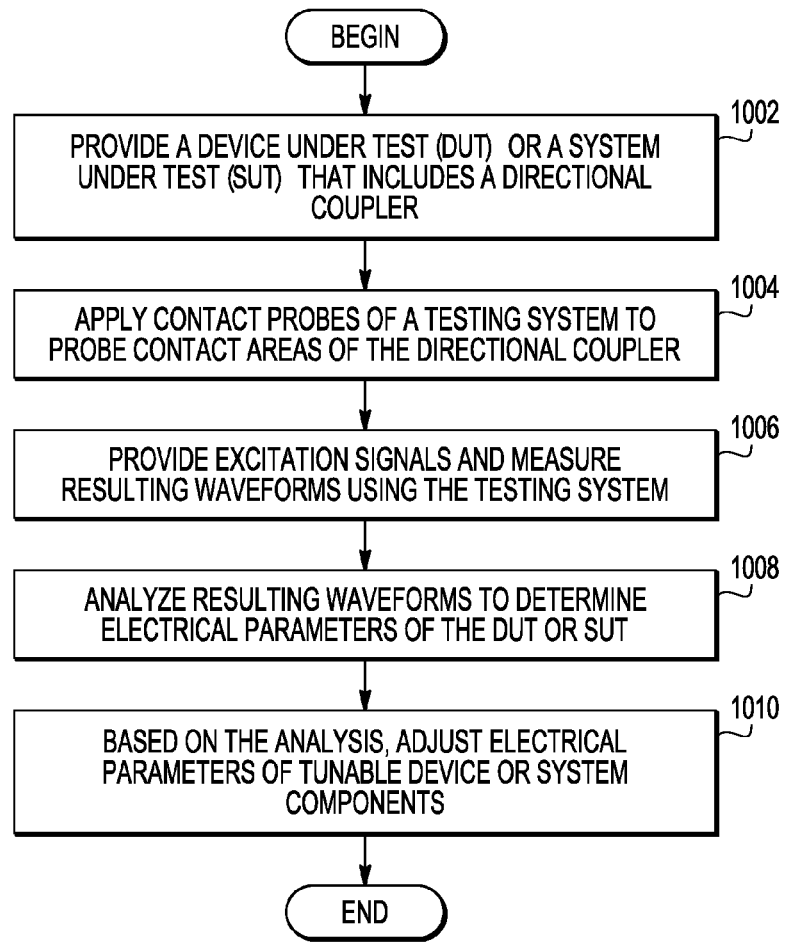
FIG. 10 illustrates a flowchart of a method for determining electrical parameters of a device or system using a directional coupler, according to an example embodiment.

FIG. 10 illustrates a flowchart of a method for determining electrical parameters of a device or system (e.g., Doherty amplifier 700, FIG. 7) using a directional coupler, according to an example embodiment. The method begins, in block 1002, by providing a device under test (DUT) or a system under test (SUT) (e.g., Doherty amplifier 700, FIG. 7, or some other device or system) that includes one or more directional couplers (e.g., directional couplers 716, 718, FIG. 7), according to an embodiment. In block 1004, contact probes of a testing system are applied to probe contact areas of the directional coupler. For example, the testing system may include a vector network analyzer (VNA) that includes cables and probes, and the probes may be applied to input and output ports (e.g., ports 112, 114, 132, 134, FIG. 1) of the directional coupler.

In block 1006, excitation signals (e.g., input signal 740, FIG. 1) are provided to the device or system, and the testing system (e.g., the VNA) measures the resulting incident versus reflected waveforms produced in the directional coupler. According to a particular embodiment, the testing system may analyze the resulting waveforms, in block 1008, and may produce a set of S-parameters (or other parameters, such as Y-parameters, Z-parameters, and/or H-parameters). In an embodiment, the set of S-parameters may be defined to include an input reflection coefficient parameter ($S_{11}$), an output reflection coefficient parameter ($S_{22}$), a forward transmission gain parameter ($S_{21}$), and a reverse transmission gain parameter ($S_{12}$), where "1" indicates each directional coupler's input port and "2" indicates each directional coupler's output port. To measure the input reflection coefficient parameter ($S_{11}$), for example, the output port may be terminated by a matched load, and an excitation signal (e.g., an amplified version of input signal 740, FIG. 7) may be provided to the input port. A responsive, reflected signal at the input port may then be measured, and the ratio of the reflected signal to the excitation signal may define the input reflection coefficient parameter ($S_{11}$). The output reflection coefficient parameter ($S_{22}$) may be similarly measured at the directional coupler's output port. To measure the forward transmission gain parameter ($S_{21}$), an excitation signal may be provided at the input port, and a responsive signal transmitted through the directional coupler may be measured at the output port. Again, the ratio of the responsive signal to the excitation signal may define the forward transmission gain parameter. The reverse transmission gain parameter ($S_{12}$) may be similarly measured by providing the excitation signal instead at the directional coupler's output port, and measuring the responsive signal at the input port. Based on an analysis of the determined forward and reverse transmission gain parameters, electrical parameters of tunable components of the device or system may be adjusted, in block 1010 (e.g., OMCs 704, 708 may be tuned toward an optimal solution). The method may then end, or the method may be repeated one or more times to further tune the device or system components (e.g., toward an optimally tuned configuration).

As discussed previously, directional couplers of the various embodiments may be integrated into devices and systems in which incident and reflected waveform monitoring is desired during the operational life of the device or system. For example, but not by way of limitation, directional couplers of the various embodiments may be integrated into the transmitter or transceiver of a wireless communication device. When a directional coupler according to an embodiment is incorporated into such a wireless communication device, waveforms produced in the directional coupler may be analyzed during operation of the wireless communication device to determine electrical parameters of the system, and that information may be used to adjust the operation of the transmitter or transceiver.

Figure 11:
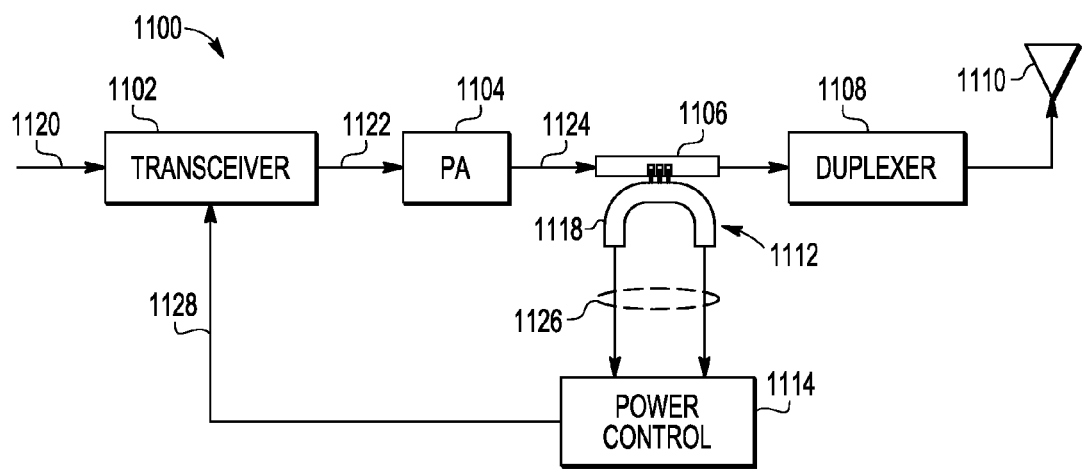
FIG. 11 illustrates a simplified block diagram of a portion of a communication device that includes a directional coupler, according to an example embodiment.

FIG. 11 illustrates a simplified block diagram of a portion of a communication device 1100 that includes a directional coupler 1112, according to an example embodiment. For example, communication device 1100 may be any type of device that transmits radio frequency (RF) signals, including but not limited to a cellular telephone, a radio, a computer, a portable entertainment device, a remote control device, a gaming system, a base station, a wireless relay or repeater, and so on. In an embodiment, communication device 1100 includes a transceiver 1102 (or transmitter), a power amplifier (PA) 1104, an output transmission line 1106, a duplexer 1108, an antenna 1110, a directional coupler 1112, and a power control module 1114. Along the forward transmission path, an input signal 1120 (e.g., a baseband or intermediate frequency signal) is provided to transceiver 1102. Transceiver 1102 manipulates the input signal 1120 (e.g., by filtering, upconverting, and performing gain control, among other things) to produce an RF signal 1122. Power amplifier 1104 then amplifies the RF signal 1122 to produce an amplified incident signal 1124 on output transmission line 1106. Duplexer 1108 may then switch the amplified incident signal 1124 to antenna 1110, which radiates the signal over the air interface. Changes in the external environment may result in mismatch, which may increase reflected power in output transmission line 1106 under certain circumstances.

Directional coupler 1112 includes a portion of the output transmission line 1106 as its main line (or transmission line) and an auxiliary arm (coupling line) 1118, in an embodiment. Directional coupler 1112 is configured to produce feedback signals 1126, which are proportional in magnitude to the transmitted and reflected power of the waves traveling along the output transmission line 1106. Power control module 1114 analyzes the feedback signals 1126 from directional coupler 1112, and provides one or more control signals 1128 to transceiver 1102. These control signals 1128 may cause transceiver 1102 to perform various power adjustments, to enable power amplifier 1104 to produce the amplifier incident signal 1124 at a desired power level.

Figure 12:
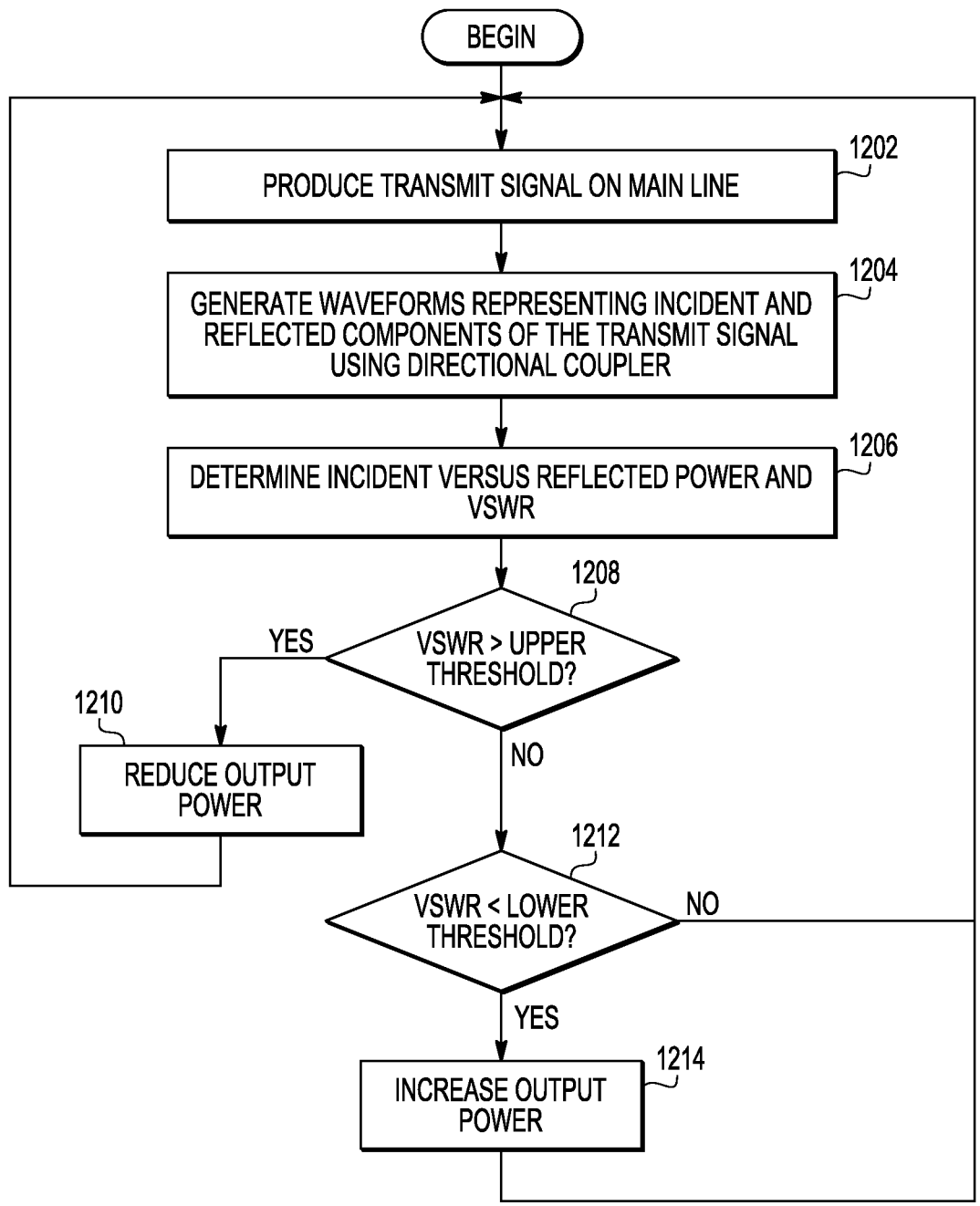
FIG. 12 illustrates a flowchart of a method for using a directional coupler to control operations of an electronic device, according to an example embodiment.

FIG. 12 illustrates a flowchart of a method for using a directional coupler (e.g., one of directional couplers 100, 200, 300, 400, 500, 600, FIGS. 1-6) to control operations of an electronic device (e.g., performing transmission power control in a communication device that includes a directional coupler), according to an example embodiment. For example, embodiments of the below-described method may be used in a system such as communication device 1100, FIG. 11, although embodiments may be used in various other systems, as well.

The method begins, in block 1202, by producing a transmit signal (e.g., signal 924) on a transmission line (e.g., output transmission line 906), where the transmit signal is characterized by an output power. The transmit signal may be produced, for example, by a transceiver (e.g., transceiver 902) and an amplifier (e.g., PA 904) of the communication device. In block 1204, a directional coupler (e.g., directional coupler 912) generates waveforms (e.g., signals 926) that represent the incident and reflected components of waveforms traveling along the transmission line. From the incident and reflected waveforms, incident and reflected power are determined, in block 1206. In addition, a variable standing wave ratio (VSWR) may be calculated from the incident and reflected power.

In block 1208, a determination is made whether the VSWR exceeds an upper threshold. If so, then the system may reduce the output power, in block 1210 (e.g., power control module 914 may produce control signals 928 that cause transceiver 902 to reduce the output power), and the method then may iterate as shown. When the VSWR does not exceed the upper threshold, a further determination may be made whether the VSWR is less than a lower threshold, in block 1212. If not, the system may bypass the process of adjusting the output power, and the method may iterate as shown. However, when the VSWR is less than the lower threshold, then the system may increase the output power, in block 1214 (e.g., power control module 914 may produce control signals 928 that cause transceiver 902 to increase the output power). The method may then iterate as shown. Embodiments of the method described in conjunction with FIG. 12 enable a system to produce an output signal having an output power that is close to a target power level, or at least within a target range.

Figure 13:
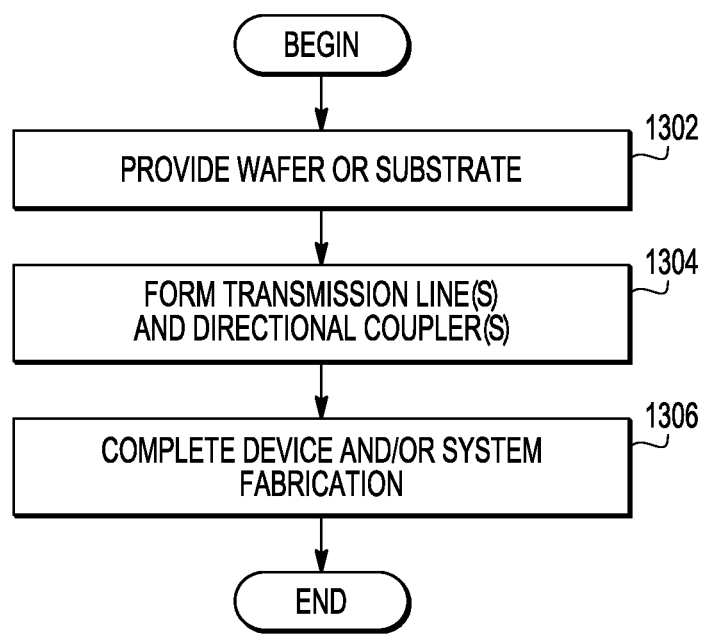
FIG. 13 illustrates a flowchart of a method for fabricating a device or system that includes a directional coupler, according to an example embodiment.

FIG. 13 illustrates a flowchart of a method for fabricating a device or system that includes a directional coupler, according to an example embodiment. The method may begin, in block 1302, by providing a wafer or substrate (e.g., substrate 102, FIG. 1). According to various embodiments, the substrate may be a printed circuit board, a semiconductor wafer or another type of rigid or semi-rigid structure conducive to providing structural support for a directional coupler and other integrated or discrete components. For example, the substrate may be a semiconductor wafer upon which a device may be fabricated and tested (e.g., an amplifier whose electrical parameters are to be tested by a testing system during device design and/or during the operational life of the system).

In block 1304, one or more transmission lines and one or more directional couplers are formed on the top surface of the substrate. The transmission lines and directional couplers may be formed using conventional techniques for forming patterned conductive material, including, for example, various additive or subtractive material deposition techniques used for forming micro strip lines. As discussed in detail above, directional couplers of various embodiments may be formed to include reflection coefficient manipulators and, in some embodiments, tapered or curved capacitive coupling structures. In an embodiment, each reflection coefficient manipulator is integrally formed with the main line and/or the auxiliary arm of the directional coupler (e.g., using the same materials and during the same processing steps). In other embodiments, a reflection coefficient manipulator may be formed from different materials and/or during different processing steps from the materials and/or processing steps used to form the main line and auxiliary arm. In block 1306, fabrication of the device or system may then be completed, such as by adding additional discrete or integrated devices, conductors, insulators, and other system elements to the device or system. The method may then end.

Thus, various embodiments of directional couplers and devices/systems in which such directional couplers are implemented, along with methods for their manufacture and use have been described above. As indicated previously, by unevenly changing the characteristic impedance of the coupled lines (i.e., the main line and the coupling line), even and odd reflection coefficients may be equalized, which may result in relatively high directivity for the directional coupler, when compared with traditional directional couplers. In addition, the inclusion of tapered or curved capacitive coupling structures on the coupling line, in an embodiment, provides gradual capacitive coupling between the coupled lines as a function of frequency, thus potentially increasing the overall operating bandwidth of the directional coupler, when compared with traditional directional couplers.

An embodiment includes a directional coupler that includes a set of coupled lines and a reflection coefficient manipulator. The set of coupled lines includes first and second conductive structures. The first conductive structure has a first port, a second port, and a substantially linear, first conductive central portion between the first port and the second port. The second conductive structure has a third port, a fourth port, and a substantially linear, second conductive central portion between the third port and the fourth port. A principal axis of the first conductive central portion is substantially parallel to a principal axis of the second conductive central portion, and a first edge of the first conductive central portion is spatially separated from a second edge of the second conductive central portion across a gap. The reflection coefficient manipulator is integrated with the set of coupled lines and is disposed in proximity to the gap. The reflection coefficient manipulator is configured to substantially equate a first reflection coefficient of the first conductive structure and a second reflection coefficient of the second conductive structure.

Another embodiment includes an electronic device that includes an electrical subsystem, a set of coupled lines, and a reflection coefficient manipulator. The set of coupled lines includes an output transmission line and an auxiliary arm. The output transmission line is coupled to the electrical subsystem, and has a first port, a second port, and a substantially linear, first conductive central portion between the first port and the second port. The auxiliary arm has a third port, a fourth port, and a substantially linear, second conductive central portion between the third port and the fourth port. A principal axis of the first conductive central portion is substantially parallel to a principal axis of the second conductive central portion, and a first edge of the first conductive central portion is spatially separated from a second edge of the second conductive central portion across a gap. The reflection coefficient manipulator is integrated with the set of coupled lines and is disposed in proximity to the gap. The reflection coefficient manipulator is configured to substantially equate a first reflection coefficient of the output transmission line and a second signal reflection coefficient of the auxiliary arm.

Yet another embodiment includes a method for using a directional coupler to control operations of an electronic device. The method includes the steps of producing a signal on a transmission line, where the signal is characterized by an output power, generating, by a directional coupler that is coupled with the transmission line, signals representing an incident component and a reflected component of waveforms traveling along the transmission line, and controlling operations of the electronic device based on the signals representing the incident component and the reflected component. The directional coupler includes a set of coupled lines and a reflection coefficient manipulator. The set of coupled lines includes first and second conductive structures. The first conductive structure has a first port, a second port, and a substantially linear, first conductive central portion between the first port and the second port. The second conductive structure has a third port, a fourth port, and a substantially linear, second conductive central portion between the third port and the fourth port. A principal axis of the first conductive central portion is substantially parallel to a principal axis of the second conductive central portion, and a first edge of the first conductive central portion is spatially separated from a second edge of the second conductive central portion across a gap. The reflection coefficient manipulator is integrated with the set of coupled lines and is disposed in proximity to the gap. The reflection coefficient manipulator is configured to substantially equate a first reflection coefficient of the first conductive structure and a second reflection coefficient of the second conductive structure.

Yet another embodiment includes a method for fabricating a directional coupler, which includes the steps of providing a substrate, forming a set of coupled lines on the substrate, and forming a reflection coefficient manipulator that is integrated with the set of coupled lines and disposed in proximity to the gap. The set of coupled lines includes a first conductive structure and a second conductive structure. The first conductive structure has a first port, a second port, and a substantially linear, first conductive central portion between the first port and the second port. The second conductive structure has a third port, a fourth port, and a substantially linear, second conductive central portion between the third port and the fourth port. The principal axis of the first conductive central portion is substantially parallel to a principal axis of the second conductive central portion, and a first edge of the first conductive central portion is spatially separated from a second edge of the second conductive central portion across a gap. The reflection coefficient manipulator is configured to equate a first reflection coefficient of the first conductive structure and a second reflection coefficient of the second conductive structure.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A directional coupler comprising:
   a set of coupled lines that includes:
      a first conductive structure having a first port, a second port, and a substantially linear, first conductive central portion between the first port and the second port, and
      second conductive structure having a third port, a fourth port, a first conductive arm coupled to the first port, a second conductive arm coupled to the fourth port, a substantially linear, second conductive central portion having a principal axis that is perpendicular to principal axes of the first and second conductive arms, a first capacitive coupling structure coupled between the first conductive arm and a first end of the second conductive central portion, a second capacitive coupling structure coupled between the second conductive arm and a second end of the second conductive central portion, wherein the first and second capacitive coupling structures each include a continuously curving edge oriented toward the first conductive structure,
      wherein a principal axis of the first conductive central portion is substantially parallel to the principal axis of the second conductive central portion, and a first edge of the first conductive central portion is spatially separated from a second edge of the second conductive central portion across a gap; and
   a reflection coefficient manipulator integrated with the set of coupled lines and disposed in proximity to the gap, wherein the reflection coefficient manipulator is configured to substantially equate a first reflection coefficient of the first conductive structure and a second reflection coefficient of the second conductive structure.

2. The directional coupler of claim 1, wherein the reflection coefficient manipulator comprises:
   a set of first conductive protrusions coupled with the first conductive central portion and extending from the first edge toward the second edge; and
   a set of second conductive protrusions coupled with the second conductive central portion, extending from the second edge toward the first edge, and interleaved with the set of first conductive protrusions.

3. The directional coupler of claim 1, wherein the reflection coefficient manipulator comprises:
   a set of slits in the first conductive central portion, which extend into the first conductive central portion from the first edge.

4. The directional coupler of claim 3, wherein the reflection coefficient manipulator further comprises:
a set of conductive protrusions coupled with the second conductive central portion and extending from the second edge into the set of slits in the first conductive central portion, whereas the set of conductive protrusions is electrically isolated from the first conductive central portion.

5. A directional coupler comprising:
a set of coupled lines that includes:
a first conductive structure having a first port, a second port, and a substantially linear, first conductive central portion between the first port and the second port, and
a second conductive structure having a third port, a fourth port, and a substantially linear, second conductive central portion between the third port and the fourth port,
wherein a principal axis of the first conductive central portion is substantially parallel to a principal axis of the second conductive central portion, and a first edge of the first conductive central portion is spatially separated from a second edge of the second conductive central portion across a gap; and
a reflection coefficient manipulator integrated with the set of coupled lines and disposed in proximity to the gap, wherein the reflection coefficient manipulator is configured to substantially equate a first reflection coefficient of the first conductive structure and a second reflection coefficient of the second conductive structure, and the reflection coefficient manipulator comprises a set of slits in the second conductive central portion, which extend into the second conductive central portion from the second edge, and wherein no portion of the second conductive structure extends into the gap between the first and second conductive central portions.

6. The directional coupler of claim 5, wherein the reflection coefficient manipulator further comprises:
a set of conductive protrusions coupled with the first conductive central portion and extending from the first edge into the set of slits in the second conductive central portion, whereas the set of conductive protrusions is electrically isolated from the second conductive central portion.

7. The directional coupler of claim 1, wherein the second conductive central portion has a first end and a second end, and the second conductive structure further comprises:
a first capacitive coupling structure coupled to the first end of the second conductive central portion, wherein the first capacitive coupling structure has a third edge oriented toward the first conductive structure.

8. The directional coupler of claim 7, wherein the second conductive structure further comprises:
a second capacitive coupling structure coupled to the second end of the second conductive central portion, wherein the second capacitive coupling structure has a fourth edge oriented toward the first conductive structure.

9. The directional coupler of claim 8, wherein the third edge and the fourth edge have curved shapes.

10. The directional coupler of claim 8, wherein the third edge and the fourth edge are substantially linear.

11. The directional coupler of claim 1, further comprising a substrate having a surface, wherein the first conductive structure and the second conductive structure are fabricated on the surface of the substrate to form a micro strip directional coupler.

12. An electronic device comprising:
an electrical subsystem;
a set of coupled lines that includes
an output transmission line coupled to the electrical subsystem, and having a first port, a second port, and a substantially linear, first conductive central portion between the first port and the second port, and
an auxiliary arm having a third port, a fourth port, a first conductive arm coupled to the first port, a second conductive arm coupled to the fourth port, a substantially linear, second conductive central portion having a principal axis that is perpendicular to principal axes of the first and second conductive arms, a first capacitive coupling structure coupled between the first conductive arm and a first end of the second conductive central portion, a second capacitive coupling structure coupled between the second conductive arm and a second end of the second conductive central portion, wherein the first and second capacitive coupling structures each include a continuously curving edge oriented toward the first conductive structure,
wherein a principal axis of the first conductive central portion is substantially parallel to principal axis of the second conductive central portion, and a first edge of the first conductive central portion is spatially separated from a second edge of the second conductive central portion across a gap; and
a reflection coefficient manipulator integrated with the set of coupled lines and disposed in proximity to the gap, wherein the reflection coefficient manipulator is configured to substantially equate a first reflection coefficient of the output transmission line and a second signal reflection coefficient of the auxiliary arm.

13. The electronic device of claim 12, wherein the reflection coefficient manipulator comprises:
a set of first conductive protrusions coupled with the first conductive central portion and extending from the first edge toward the second edge; and
a set of second conductive protrusions coupled with the second conductive central portion, extending from the second edge toward the first edge, and interleaved with the set of first conductive protrusions.

14. The electronic device of claim 12, wherein the reflection coefficient manipulator comprises:
a set of slits in the first conductive central portion, which extend into the first conductive central portion from the first edge; and
a set of conductive protrusions coupled with the second conductive central portion and extending from the second edge into the set of slits in the first conductive central portion, whereas the set of conductive protrusions is electrically isolated from the first conductive central portion.

15. The electronic device of claim 12, wherein the reflection coefficient manipulator comprises:
a set of slits in the second conductive central portion, which extend into the second conductive central portion from the second edge; and
a set of conductive protrusions coupled with the first conductive central portion and extending from the first edge into the set of slits in the second conductive central portion, whereas the set of conductive protrusions is electrically isolated from the second conductive central portion.

16. The electronic device of claim 12, wherein the electrical subsystem is a transmitter, and the electronic device is a wireless communication device.

17. The electronic device of claim 12, wherein the electrical subsystem is selected from a group consisting of a Doherty amplifier, a linear class AB amplifier, and an efficient drain-modulated amplifier.

18. A method for using a directional coupler to control operations of an electronic device, the method comprising the steps of:

producing a signal on a transmission line, wherein the signal is characterized by an output power;

generating, by a directional coupler that is coupled with the transmission line, signals representing an incident component and a reflected component of waveforms traveling along the transmission line, wherein the directional coupler comprises a set of coupled lines that includes a first conductive structure having a first port, a second port, and a substantially linear, first conductive central portion between the first port and the second port, and a second conductive structure having a third port, a fourth port, a first conductive arm coupled to the first port, a second conductive arm coupled to the fourth port, a substantially linear, second conductive central portion having a principal axis that is perpendicular to principal axes of the first and second conductive arms, a first capacitive coupling structure coupled between the first conductive arm and a first end of the second conductive central portion, a second capacitive coupling structure coupled between the second conductive arm and a second end of the second conductive central portion, wherein the first and second capacitive coupling structures each include a continuously curving edge oriented toward the first conductive structure, wherein a principal axis of the first conductive central portion is substantially parallel to the principal axis of the second conductive central portion, and a first edge of the first conductive central portion is spatially separated from a second edge of the second conductive central portion across a gap, and a reflection coefficient manipulator integrated with the set of coupled lines and disposed in proximity to the gap, wherein the reflection coefficient manipulator is configured to substantially equate a first reflection coefficient of the first conductive structure and a second reflection coefficient of the second conductive structure; and controlling operations of the electronic device based on the signals representing the incident component and the reflected component.

19. The method of claim 18, further comprising the steps of:

determining incident power from the incident component;
determining reflected power from the reflected component;
calculating a variable standing wave ratio (VSWR) from the incident power and the reflected power; and
determining whether the VSWR exceeds a threshold, and when the VSWR exceeds the threshold, controlling operations of the electronic device comprises the step of reducing the output power of the signal.

20. The method of claim 18, further comprising the steps of:

determining incident power from the incident component;
determining reflected power from the reflected component;
calculating a variable standing wave ratio (VSWR) from the incident power and the reflected power; and
determining whether the VSWR is less than a threshold, and
when the VSWR is less than the threshold, controlling operations of the electronic device comprises the step of increasing the output power of the signal.

* * * * *